United States Patent
Pruvost et al.

(10) Patent No.: US 7,586,195 B2
(45) Date of Patent: Sep. 8, 2009

(54) SEMICONDUCTOR DEVICE

(75) Inventors: Sébastien Pruvost, Froges (FR); Frédéric Gianesello, Saint-Pierre D'albigny (FR)

(73) Assignee: STMicroelectronics S.A., Montrouge (FR)

( * ) Notice: Subject to any disclaimer, the term of this patent is extended or adjusted under 35 U.S.C. 154(b) by 330 days.

(21) Appl. No.: 11/541,960

(22) Filed: Oct. 2, 2006

(65) Prior Publication Data

US 2008/0079170 A1 Apr. 3, 2008

(51) Int. Cl.
*H01L 23/48* (2006.01)
(52) U.S. Cl. .................. 257/750; 257/758; 257/E23.02; 257/E23.062; 257/E23.142; 257/E23.143; 257/E23.144
(58) Field of Classification Search .................. 257/750, 257/758, E23.02, E23.062, E23.142, E23.143, 257/E23.144
See application file for complete search history.

(56) References Cited

U.S. PATENT DOCUMENTS 5,986,331 A * 11/1999 Letavic et al. ............... 257/664
2003/0148558 A1 * 8/2003 Kubo et al. .................. 438/128

OTHER PUBLICATIONS

F. Gianesello, et al., "State of the art integrated millimeter wave passive components and circuits in advanced thin SOI CMOS technology on High Resistivity substrate," IEEE SOI conference, Hawaii, Oct. 2005.

* cited by examiner

*Primary Examiner*—Long K Tran
(74) *Attorney, Agent, or Firm*—Gardere Wynne Sewell LLP

(57) ABSTRACT

An electronic component for microwave transmission includes a high resistivity substrate on which is at least located several metallization layers divided into portions. A first set of piled up portions defines a ground ribbon and a second set of piled up portions defines a power ribbon. At least a first active portion of said ground ribbon and a first active portion of said power ribbon are respectively located between the substrate and an uppermost one of the several metallization layers. The electronic component in one implementation is a coplanar waveguide.

13 Claims, 4 Drawing Sheets

SEMICONDUCTOR DEVICE

BACKGROUND OF THE INVENTION

1. Technical Field of the Invention

The present invention related generally to the domain of high resistivity silicon substrate, and more particularly, to an electronic component using this technology.

2. Description of Related Art

Silicon on insulator (SOI) is a layered structure created on an insulating substrate.

With regard to electronic components such as transistors, SOI differs from generic CMOS in that its silicon junction is above an electrical insulator.

The advantage is that this insulator reduces the capacitance, meaning a SOI transistor has less to charge-up before completing a switch, which results in reduced switching time and reduced switching energy over CMOS-based chips. Also, there is a reduction in transistor leakage current.

Such a process reduces the amount of electrical charge that a transistor has to move during a switching operation, thus increasing speed.

As an example, SOI can be used as an alternative to bulk silicon for the manufacturing of microwave transistors.

As known to those skilled in the art, a SOI is a layered structure, generally made of piled up layers of copper, in which the last layer of metallization, i.e. the most distant from the substrate, called a conductive layer, is used for the transport of current, i.e. electrically connected to a power supply source.

Intermediate layers, located between said substrate and said last metallization layer, are used, e.g. for protective or isolation purposes, or more generally not used.

Additionally to this set of metallization layers, power can be supplied to the last layer of metallization through a power supply layer, e.g. made of aluminum.

It is known to those skilled in the art that the distance between the substrate and the conductive last metallization layer must be over a given value, depending on the technology (65 nm, 130 nm, etc.) and other parameters.

For example, the electronic component may be a coplanar waveguide. A coplanar waveguide comprises a central ribbon connected to a power supply source, and two symmetrical ground ribbons connected to a ground potential and located on both sides of said central ribbon.

It is commonly accepted that the distance between the central ribbon and its adjacent ground ribbon depends on the distance (height) between the last layer of metallization and the substrate.

Said distance (height) is considered to be a constraint with regard to the evolution of techniques and customer needs which lead to the reduction of thickness of all components and layers. Said reduction increases risks of electrical losses in the substrate.

And is it commonly accepted that decreasing said distance (height) between the last layer of metallization and the substrate would lead to increase the parasitic capacitance between the transmission line and the substrate.

SUMMARY OF THE INVENTION

In accordance with an aspect of the invention an electronic component is provided wherein any of the back-end metallization layers can be used.

In a particular embodiment, all the back-end metallization layers are electrically connected together.

An implementation of the invention is a coplanar waveguide transmission line.

An embodiment is an electronic component comprising: a high resistivity substrate on which is at least located a plurality of metallization layers of a first type comprising an uppermost metallization layer being the most distant from the substrate, each of said metallization layers of the first type being cut up to form portions, wherein a first set of piled up portions define a ground ribbon comprising at least a first active portion electrically connected to a ground source, wherein a second set of piled up portions define a power ribbon comprising at least a first active portion electrically connected to a power supply source, and wherein both said first active portion of said ground ribbon and said first active portion of said power ribbon are located between the substrate and the uppermost metallization layer.

In an embodiment, the component is a coplanar waveguide.

In another embodiment, an electronic component comprises a high resistivity substrate; and a plurality of metallization levels layered above the high resistivity substrate, said plurality of metallization levels divided into a first portion defining a first ribbon and a second portion defining a second ribbon next to the first ribbon, wherein at least one of the metallization levels other than a last metallization level furthest away from the high resistivity substrate is an active layer of a coplanar waveguide formed by the first and second ribbons and used for signal propagation.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
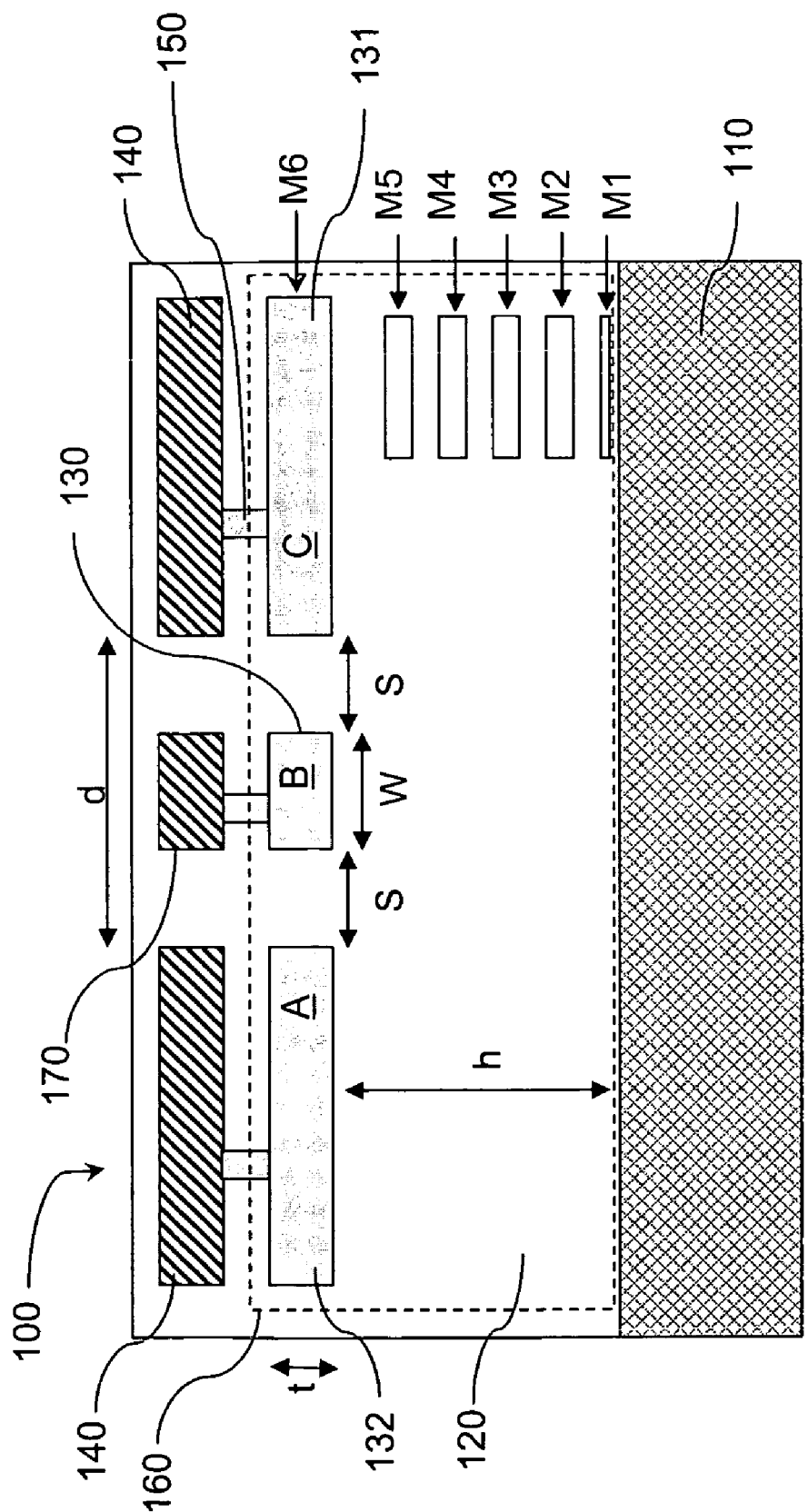
FIG. 1 is a schematic transversal view of an electronic component according to prior art.

An electronic component using SOI technology according to the prior art is described with reference to FIG. 1.

To simplify the present description, the electronic component 100 represents a conventional coplanar waveguide.

It comprises a high resistivity substrate 110.

On this substrate, a set 160 of piled up metallization layers is disposed within an insulating region 120, typically made of silicon oxide $SiO_2$.

In this embodiment, said coplanar waveguide comprises a set of six layers of metallization defining a transmission line.

Each layer M1, M2, M3, M4, M5, M6, located above the substrate, i.e. at the back-end level, is typically made of copper and has a respective thickness depending on the technology node (65 nm, 130 nm, etc.).

Dealing with high or ultra high (microwave) frequencies, the transmission line according to the prior art only comprises the last metallization layer M6 having a thickness t as an active layer.

By active layer, it is understood that the transmission line comprises a first portion A and a third portion C, both of them being electrically connected to the ground potential, and a second portion B, said second portion being electrically connected to a power supply source.

This structure of said transmission line corresponds to a central ribbon 130, also called "central strip," having a width W, said central ribbon 130 comprising said second portion B; and two ground ribbons 131, 132, also called "ground planes," said ground ribbons comprising respectively said first portion A and said third portion C; said ground ribbons being symmetric with regard to said central ribbon 130. Each ground ribbon is at a distance S from the central ribbon 130.

Said ground ribbons 131, 132, are separated by an inter-ground distance d equal to the following equation: d=2 S+W.

As known to one skilled in the art, the only active metallization layer is the more distant metallization layer M6 from the substrate 110, situated at a distance h from the substrate 110.

The greater the distance W, the smaller the resistance of the ribbon. The greater distance S, the smaller the capacitive effect between the transmission line M6 and the substrate 110.

The characteristic impedance depends on the inter-ground distance d.

Power is supplied to the central ribbon 130 by a power supply aluminum level 170, located above the last conductive metallization level M6. Said central ribbon 130 is electrically connected to said power supply aluminum level 170 by means of electric connection means 150 like one or more vias.

Similarly, ground ribbons 131, 132, are respectively electrically connected to ground supply aluminum level 140, located at the same level as the power supply level 170. Said ground ribbons 131, 132, are electrically connected to said ground supply aluminum level 140 by means of electric connection means 150 like one or more vias.

Figure 2:
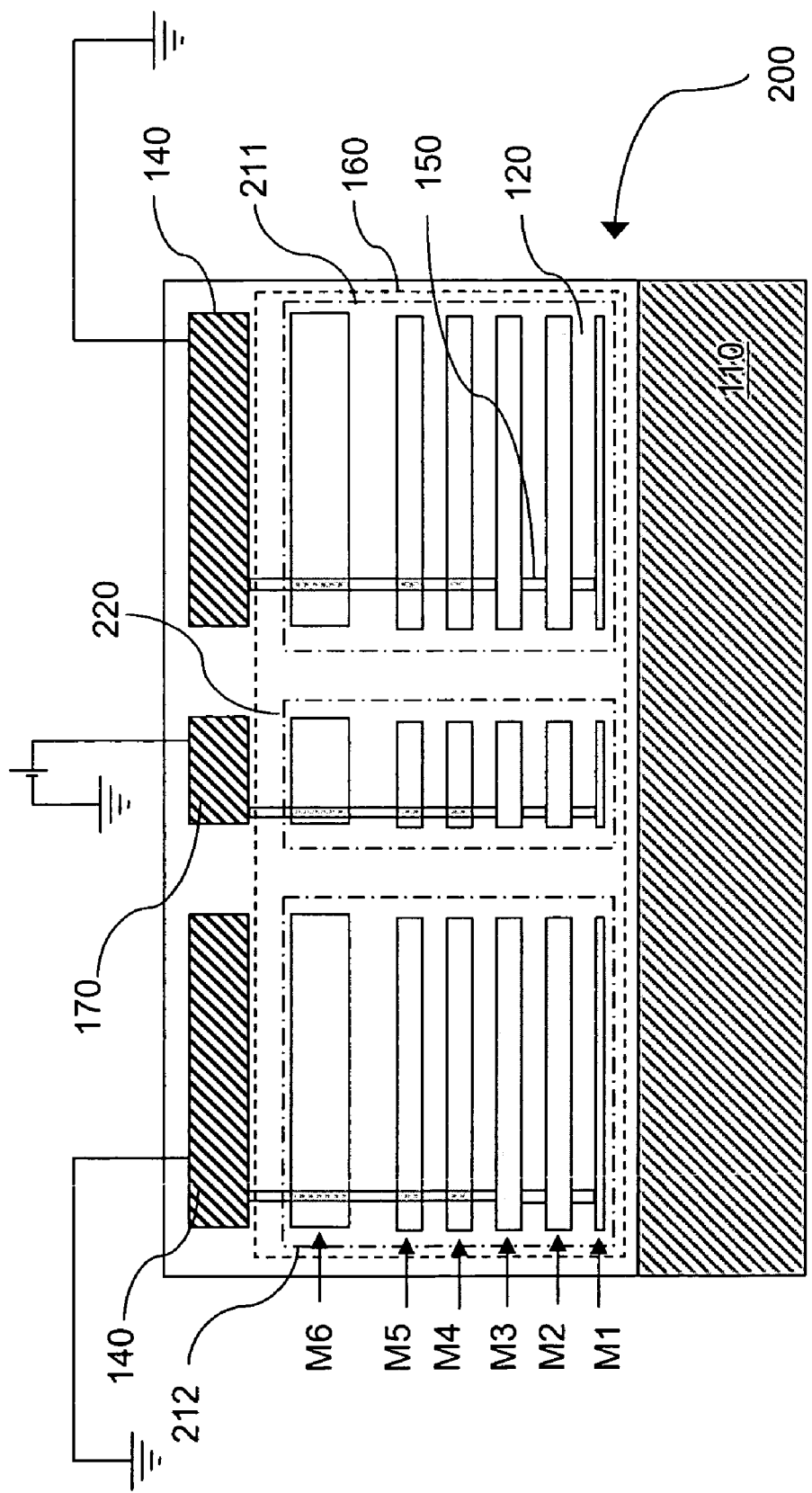
FIG. 2 is a schematic transversal view of an electronic component according to the invention.

An electronic component according to an embodiment of the invention, such as a coplanar waveguide 200, is represented on FIG. 2.

With regard to FIGS. 1 and 2, the common elements have the same reference numbers.

The coplanar waveguide 200 according to the invention thus comprises a high resistivity substrate 110. By high resistivity substrate, it is understood a resistivity greater than or equal to 100 Ohm.cm.

In FIG. 2, on top of said substrate comprises a set 160 of piled up metallization layers disposed within an insulating region 120, typically made of silicon oxide $SiO_2$.

In this embodiment, said coplanar waveguide comprises six layers of metallization.

Each layer M1, M2, M3, M4, M5, M6 is typically made of copper and has a respective thickness depending on the node (65 nm, 130 nm, etc.).

Power is supplied to the central ribbon 220, further called a power ribbon, by a power supply aluminum level 170, located above the last metallization level M6, from which a portion is connected to a power supply source and acts as a power supply source with regard to the central ribbon 220.

Said central ribbon 220 is electrically connected to said power supply aluminum level 170 by means of electric connection means 150 like one or more vias.

Said central ribbon comprises a set of piled up portions of metallization layers.

Similarly, ground ribbons 211, 212, are respectively electrically connected to ground supply aluminum level 140, from which a portion is connected to a ground source and acts as a ground source with regard to said ground ribbons, said ground supply aluminum level 140 being located at the same level as the power supply level 170.

Said ground ribbons 211, 212, are electrically connected to said ground supply aluminum level 140 by means of electric connection means 150 like one or more vias.

Said ground ribbons comprise respectively a set of piled up portions of metallization layers.

According to the invention, each ribbon (central ribbon, ground ribbons) thus comprise a set of piled up portions of metallization layers, i.e. six metallization layers M1-M6 in the present embodiment, whereas other embodiments would include more or less metallization layers.

It is understood as known to one skilled in the art, that a portion of a metallization layer of a ribbon corresponds to the same portion of metallization layer of an adjacent ribbon, i.e. a metallization layer is cut up into several portions, from which at least one portion is likely to be connected to the ground source, and one portion is likely to be connected to the power supply source.

As described hereunder, the present invention aims to use any layer, any subset or all of the metallization layers at the back-end level.

Contrary to the general knowledge those skilled in the art, the use of another metallization level other than the last metallization layer as an active layer does not increase the losses in the substrate and so does not impact the performances of the component.

Therefore h and S can be chosen independently from each other.

Thus, any metallization layer of the back-end, other than the last metallization layer, can be used for a ultra high frequency signal propagation.

Said active metallization layer thus comprise at least a portion that is electrically connected to power supply 170, respectively a portion that is electrically connected to ground supply 140, by means of electrical connection means, like one or more vias 150.

According to the needs (e.g. current to drive, acceptable level of losses, co-integration requirement, etc.), several portions of metallization layers for a given ribbon can be electrically connected, decreasing the equivalent resistance.

With regard to the embodiment of FIG. 2, the transmission line comprises the first three metallization layers M1, M2 and M3 as active layers.

To achieve this structure, the invention comprises a first ground ribbon 211. Said first ground ribbon 211 comprises a first set of piled up portions of metallization layers M1-M6.

Said first set of piled up metallization layers comprises several active portions of metallization layers M1-M3, said active portions of metallization layers M1-M3 being electrically connected together by means of a respective via 150 and being connected to a ground source 140.

Similarly, the invention comprises a symmetrical second ground ribbon 212. Said second ground ribbon 212 comprises a second set of piled up portions of metallization layers M1-M6.

Said second set of piled up metallization layers comprises several active portions of metallization layers M1-M3, said active portions of metallization layers M1-M3 being electrically connected together by means of a respective via 150 and being connected to a ground source 140.

With regard to the central ribbon 220, it comprises a third set of piled up portions of metallization layers M1-M6.

Said third set of piled up metallization layers comprises several active portions of metallization layers M1-M3, said active portions of metallization layers M1-M3 being electrically connected together by means of a respective via 150 and being connected to a power supply source 170.

In another embodiment (not illustrated), all portions of metallization layers can be electrically connected within a given ribbon, respectively to power supply 170 with regard to the central ribbon 220, and to ground supply 140 with regard to the ground ribbons 211, 212.

According to the invention, using a SOI wafer on high resistivity substrate suppresses substrate losses, as for Ill-V technologies.

An integrated coplanar transmission line is preferred at millimeter wave range since it has better quality factor than a microstrip and it is less sensitive to process variation. Moreover, in that kind of use, microstrips on high resistivity substrate would not take benefits since said substrate is shielded.

Figure 3:
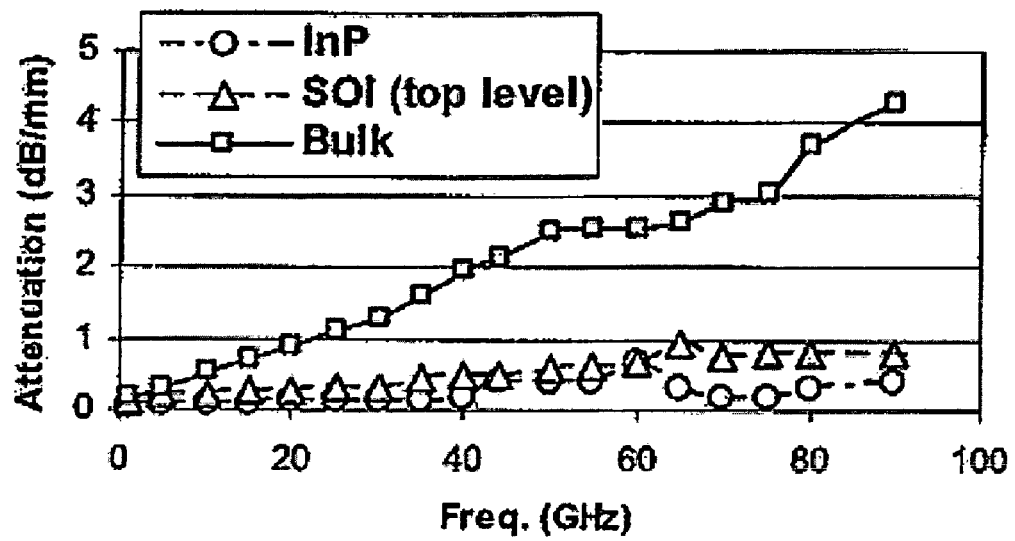
FIG. 3 is a comparison between measured 50 Ohms coplanar waveguide transmission lines performances, between top level metallization layer, bulk and InP reference.

Performances of SOI compared to InP and bulk technologies are illustrated on FIG. 3. On this figure, 50 Ohms characteristic impedance lines have been realized on bulk and high resistivity SOI where the top metallization layer is electrically connected to the power supply, and compared to InP reference.

Figure 4:
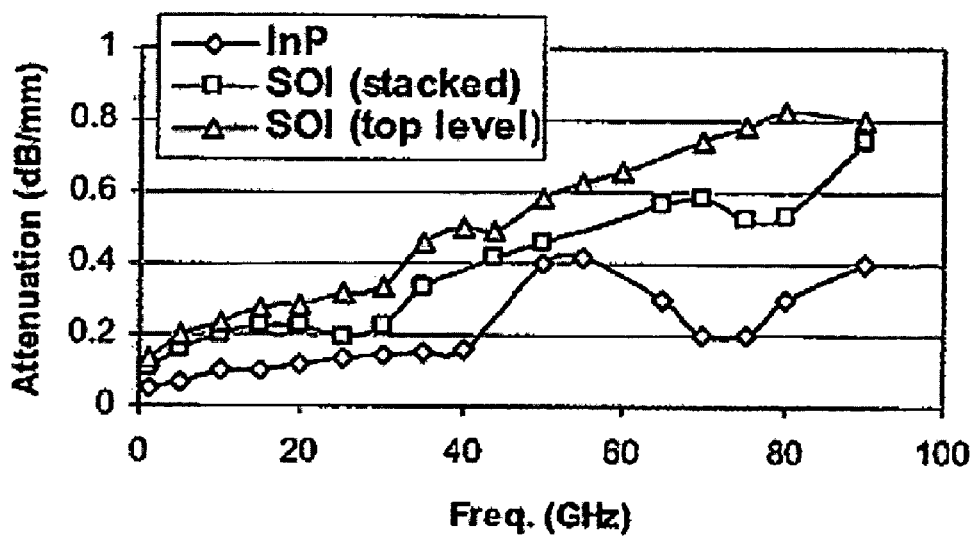
FIG. 4 is a detailed view of FIG. 3, including one embodiment of the invention using all metallization layers electrically connected together.

A more detailed view of the performances (attenuation) is illustrated on FIG. 4.

On FIG. 4, the comparison of FIG. 3 replaces the bulk technology with a 50 Ohms coplanar waveguide transmission line on high resistivity substrate according to one embodiment of the present invention, wherein all metallization layers are electrically connected.

The dimensions of the line are the same as those commonly used for W-band design on InP. The performances obtained for the invention line can be compared to the state of the art structure in GaAs or InP technologies. Such results illustrate the insulating behavior of the high resistivity substrate.

Figure 5:
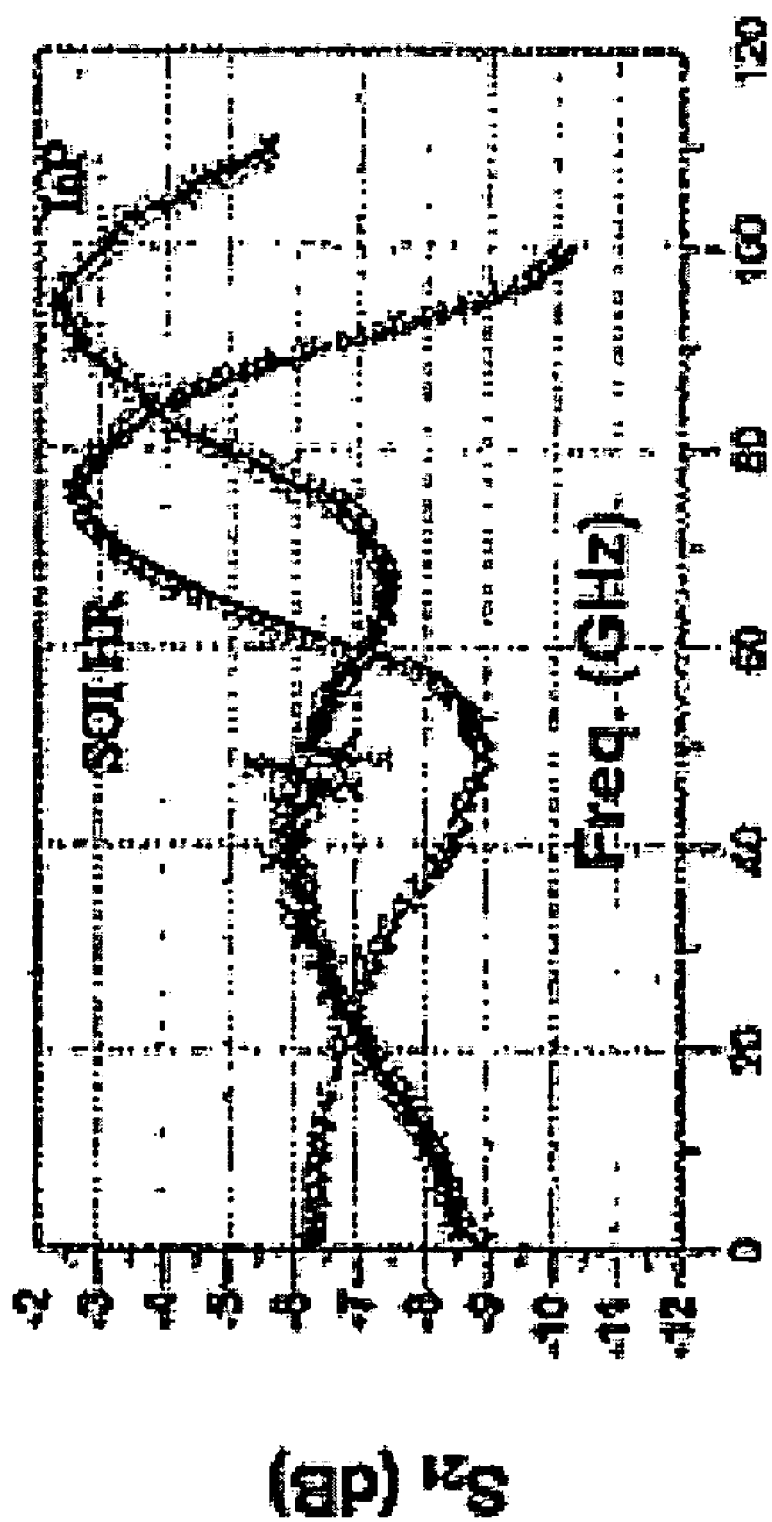
FIG. 5 is a comparison of measured performances of a hybrid coupler using the same layout.

The present invention can be implemented in a passive circuit such as a coupler. FIG. 5 represents a 94 GHz InP based hybrid coupler which has been blind ported on high resistivity SOI substrate by using the stacked coplanar waveguide transmission line embodiment of the invention (all metallization layers electrically connected). Measurements have been performed up to 110 GHz, as shown on FIG. 5. On SOI version, a shift is observed in frequency and resonates around 80 GHz due to an increase of the capacitance at the underpath level since no air bridge could be used, but the losses are very similar to InP, i.e. around 2.5 dB.

According to the invention, a standard 130 nm SOI CMOS technology on 200 mm high resistivity substrate shows passive components performances at millimeter wave frequencies equivalent to Ill-V technologies.

Moreover, high resistivity SOI technology offers advantages in term of speed and consumption for the digital integration.

Dealing with microwave frequencies, the present invention can be implemented for the manufacturing of electronic devices having cut-off frequencies greater than 150 GHz for 65 nm technology node.

The electronic component according to the invention is e.g. a coplanar waveguide, or a coupler.

It can be integrated (embedded) in an integrated circuit, especially for microwave applications.

The present invention is used, e.g. in low power SOCs, or in wireless technologies (Wimax, 60 Ghz WLAN, etc.).

While the present invention has been described in conjunction with preferred embodiments such as a coplanar waveguide or a coupler thereof, it is evident that other electronic components, many alternatives, modifications and variations will be apparent to those skilled in the art. Accordingly, it is intended to embrace all such alternatives, modifications and variations that fall within the spirit and scope thereof as set forth in the appended claims.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic component comprising:
a high resistivity substrate; and
a plurality of metallization levels layered above the high resistivity substrate, said plurality of metallization levels divided into a first portion defining a first ribbon and a second portion defining a second ribbon next to the first ribbon,
wherein at least one of the metallization levels other than a last metallization level furthest away from the high resistivity substrate is an active layer of a coplanar waveguide formed by the first and second ribbons and used for signal propagation; and
wherein the at least one of the metallization levels other than the last metallization level comprises a first plurality of metallization levels, and wherein the last metallization level furthest away from the high resistivity substrate comprises a second plurality of metallization levels, further comprising:
at least one via for each ribbon electrically connecting the metallization levels of the first plurality of metallization levels to each other and to a reference, the via extending through the metallization levels of second plurality of metallization levels without making electrical contact thereto.

2. The component of claim 1 wherein the first plurality of metallization levels are active layers of the coplanar waveguide formed by the first and second ribbons and used for signal propagation.

3. The component of claim 1 wherein said plurality of metallization levels are further divided into a third portion defining a third ribbon next to the first ribbon on a side opposite the second ribbon.

4. The component of claim 1 wherein the via for the first ribbon is coupled to a power supply reference and the via for the second ribbon is coupled to a ground reference.

5. The component of claim 1 wherein the reference is one of a supply voltage and a ground voltage.

6. An electronic component comprising
a high resistivity substrate; and
a plurality of metallization levels layered above the high resistivity substrate, said plurality of metallization levels divided into a first portion defining a first ribbon and a second portion defining a second ribbon next to the first ribbon,
wherein at least one of the metallization levels other than a last metallization level furthest away from the high resistivity substrate is an active layer of a coplanar waveguide formed by the first and second ribbons and used for signal propagation;
wherein a plurality of metallization levels other than a last metallization level furthest away from the high resistivity substrate are active layers which are interconnected with each other through vias, the via being connected to a reference voltage and the via passing through the last metallization level furthest away from the high resistivity substrate without making electrical connection thereto.

7. The component of claim 6 wherein the reference voltage is one of a supply voltage and a ground voltage.

8. An electronic component comprising:
a high resistivity substrate;
a first number of metallization layers overlying the high resistivity substrate, the first number of metallization layers divided into a first set of layers overlying the high resistivity substrate associated with a ground ribbon and a second set of layers overlying the high resistivity substrate associated with a power ribbon;
a second number of metallization layers overlying the first number of metallization layers, the second number of metallization layers divided into a third set of layers overlying the first set of layers and a fourth set of layers overlying the second set of layers;
a top metallization layer overlying the second number of metallization layers, the top metallization layer divided into a ground layer and a power layer;
a first via passing through the first and second number of metallization layers to electrically interconnect the ground layer with the first set of layers associated with the ground ribbon, but not electrically interconnecting to the third set of layers overlying the first set of layers; and
a second via passing through the first and second number of metallization layers to electrically interconnect the power layer with the second set of layers associated with the power ribbon, but not electrically interconnecting to the fourth set of layers overlying the first set of layers.

9. The component as in claim 8 wherein the first number of metallization layers consists of at least two metallization layers and the second number of metallization layers consists of one or more metallization layers.

10. The component as in claim 8 further comprising:
the first number of metallization layers further divided into a fifth set of layers overlying the high resistivity substrate associated with a second ground ribbon;
the second number of metallization layers further divided into a sixth set of layers overlying the fifth set of layers;
a third via passing through the first and second number of metallization layers to electrically interconnect the ground layer with the fifth set of layers associated with the second ground ribbon, but not electrically interconnecting to the sixth set of layers overlying the fifth set of layers.

11. The component as in claim 10 wherein the ground ribbon, power ribbon and second ground ribbon form a coplanar microwave wave guide.

12. The component as in claim 10 wherein the ground ribbon, power ribbon and second ground ribbon form a microwave coupler.

13. The component as in claim 8 wherein each of the first and second vias comprises a vertically aligned via structure passing through the first and second number of metallization layers.

* * * * *